United States Patent

Futakuchi et al.

[11] Patent Number: 5,808,522
[45] Date of Patent: Sep. 15, 1998

[54] THICKNESS SHEAR VIBRATION TYPE DOUBLE MODE FILTER HAVING A PASSIVELY DAMPED COUPLING CAPACITOR

[75] Inventors: Tomoaki Futakuchi; Masao Gamo; Hisayuki Hashimoto, all of Nagaokakyo, Japan

[73] Assignee: Murata Manufacturing Co., Ltd., Kyoto-fu, Japan

[21] Appl. No.: 661,036

[22] Filed: Jun. 10, 1996

[30] Foreign Application Priority Data

Jun. 8, 1995 [JP] Japan .................................... 7-141695

[51] Int. Cl.⁶ .............................. H03H 9/54; H03H 9/02
[52] U.S. Cl. ........................... 333/187; 310/326; 310/321
[58] Field of Search ..................................... 333/187–192; 310/321, 323, 326, 328, 333, 365–369

[56] References Cited

U.S. PATENT DOCUMENTS

| 3,676,724 | 7/1972 | Berlincourt et al. ................ 333/187 X |
| 4,037,180 | 7/1977 | De Wild ................................ 333/191 |
| 5,446,335 | 8/1995 | Hino ..................................... 310/366 X |

FOREIGN PATENT DOCUMENTS

| 55-636A | 1/1980 | Japan ................................. 333/187 F |
| 3-178210A | 8/1991 | Japan ..................................... 333/191 |

*Primary Examiner*—Robert J. Pascal
*Assistant Examiner*—Barbara Summons
*Attorney, Agent, or Firm*—Ostrolenk, Faber, Gerb & Soffen, LLP

[57] ABSTRACT

A thickness shear vibration type double mode filter includes two or more vibrating elements disposed in parallel on a piezoelectric substrate and a coupling capacitor formed on the piezoelectric substrate at a position intermediate two of the vibrating elements. The coupling capacity includes a capacitor electrode formed on one main surface of the piezoelectric substrate and an opposing ground electrode formed on a second main surface of the substrate. Input/output electrodes of the vibrating elements are formed on the same surface of the piezoelectric substrate as the capacitor electrode. A damper formed of a resin material on which no solder adheres is formed on top of the capacitor electrode and has sufficient mass to suppress undesired vibration in the area of the coupling capacitor.

8 Claims, 4 Drawing Sheets

THICKNESS SHEAR VIBRATION TYPE DOUBLE MODE FILTER HAVING A PASSIVELY DAMPED COUPLING CAPACITOR

BACKGROUND OF THE INVENTION

1. Field of the Invention

The present invention relates to a thickness shear vibration type double mode filter and more particularly to a technology for improving the waveform selectivity and reducing spurious responses of such a filter.

2. Description of Prior Art

FIG. 4 is an equivalent circuit diagram of a known thickness extension vibration type double mode filter. In this filter, a coupling capacitor C is provided between a pair of vibrating elements 1 to shape the wave form passed by the filter. However, such a coupling capacitor C has not generally been provided in a thickness shear vibration type double mode filter (hereinafter referred to as a shear double mode piezoelectric filter) with the result that its waveform selectivity has been degraded and its spurious responses have been increased. The coupling capacitor C was not provided in such piezoelectric filters for the following reasons.

A typical prior art shear double mode filter is illustrated in FIG. 5. In this figure, a capacitor electrode 16 and a damper 17 are illustrated in phantom. These elements do not exist in the prior art structure.

The prior art shear double mode filter includes a piezoelectric substrate 1 having various electrode patterns formed thereon to form vibrating elements 2 and 3. The vibrating element 2 is formed between the ground electrode 4 formed on the lower surface of piezoelectric substrate 1 and the vibrating electrodes 5 and 6 formed on the upper surface of the piezoelectric substrate 1 at a location opposing the ground electrode 4. The vibrating element 3 is formed between the ground electrode 9 formed on the lower surface of piezoelectric substrate 1 and a pair of vibrating electrodes 7 and 8 formed on the top surface of the piezoelectric substrate 1 at a location opposing the ground electrode 9.

The ground electrodes 4 and 9 are connected by bridge electrodes (unnumbered) to a central ground electrode 10 to which a lead terminal 11 has been soldered. The vibrating electrode 5 is coupled to an input/output electrode 12 to which a lead terminal 13 has been soldered. In a similar manner, the vibrating electrode 8 is coupled to input/output electrode 14 to which a lead terminal 15 has been soldered.

To form a coupling capacitor C, it is necessary to provide a capacitor electrode 16 opposing the central ground electrode 10. This would polarize the intervening portion of the piezoelectric substrate located between the ground electrode 10 and the capacitor electrode 16 thereby creating undesired vibrations in the polarized area and adversely effecting the characteristics of the filter. To avoid this problem, it would be necessary to form a damper 17 on top of the capacitor electrode 16.

In the prior art it was common to form dampers of this general type using a solder material. This increases the possibility of forming an undesirable solder bridge between the electrodes 10 and 16. This could happen in several ways.

During the process of forming the damper 17 on top of the capacitor electrode 16, it is possible that the solder would flow down the sides of the filter thereby forming a solder bridge between the capacitor electrode 16 and the central ground electrode 10.

Even if this problem was avoided, an undesired solder bridge could be formed during the process of soldering the lead terminal 11 to the central ground electrode 10. During the soldering operation, heat can be conducted through piezoelectric substrate 1 to cause the solder material of the damper 17 to melt, flow down the side of the filter and form a solder bridge between the capacitor electrode 16 and the central ground electrode 10.

A similar problem could occur when mounting the filter to a circuit board. It is common to mount filters of this type to a circuit board by soldering. The lead terminals 11, 13 and 15 are inserted into through holes (not shown) located on the circuit board. When the lead terminals are soldered to position them onto the associated electrodes, heat is applied to solder the run from the heated portion of the lead terminals into the piezoelectric substrate 1. When such a procedure is followed, it is quite possible that the solder material forming the damper 17 would melt and also cause a solder bridge to be formed between the capacitor electrode 16 and the central ground electrode 10.

For all the foregoing reasons, a central coupling capacitor C was not formed in the thickness shear mode piezoelectric filters of the prior art.

Accordingly, it is an object of the present invention to solve the aforementioned problems by providing a piezoelectric filter in which a coupling capacitor may be provided in a body without forming any solder bridge in processing and mounting the product and which can improve the waveform selectivity and reduce the spurious signals.

SUMMARY OF THE INVENTION

The thickness shear vibration type double mode filter of the present invention includes:

- a pair of vibrating elements disposed in parallel on a piezoelectric substrate;
- a coupling capacitor provided between said vibrating elements, said coupling capacitor being defined by a capacitor electrode and a ground electrode formed on opposing surfaces of said piezoelectric substrate at a position intermediate said vibrating element; and
- a damper formed of a resin material on which no solder adheres and which is located on top of said capacitor electrode.

The vibrating elements preferably include input/output electrodes which are formed on the same surface of the piezoelectric substrate as the capacitor electrode. The damper preferably covers the entire top surface of the capacitor electrode and has sufficient mass to fully damp undesired vibrations in the piezoelectric substrate in the area of the coupling capacitor.

The piezoelectric filter in accordance with the preferred embodiment of the present invention provides a damper which both serves to prevent an undesired solder bridge between the capacitor electrode and the opposing ground electrode and fully damp unnecessary vibrations.

The above and other advantages of the present invention will become more apparent in the following description and the accompanying drawings.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

DETAILED DESCRIPTION OF EMBODIMENTS OF THE INVENTION

Figure 1:
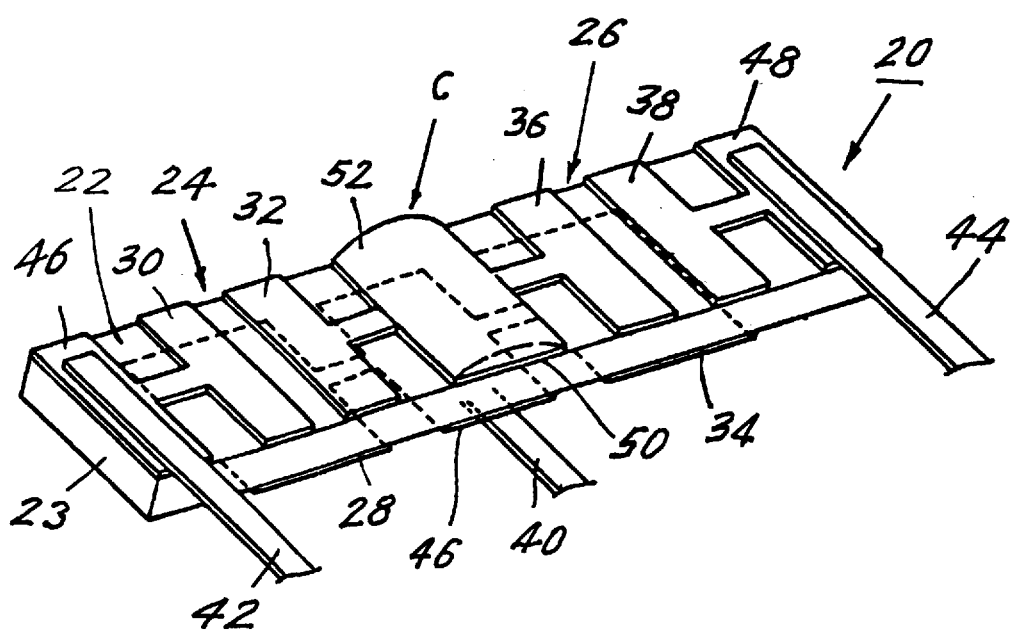
FIG. 1 is a perspective view showing a piezoelectric filter according to a preferred embodiment of the present invention.

Referring now to the drawings wherein like numerals indicate like elements, there is shown in FIG. 1 a thickness shear vibration type double mode piezoelectric filter constructed in accordance with the principles of the present invention and designated generally as 20. Piezoelectric filter 20 comprises a piezoelectric substrate 22 having electrode patterns formed on opposing main surfaces thereof which define vibrating elements 24 and 26. Vibrating element 24 is formed between a ground electrode 28 and a pair of top vibrating electrodes 30, 32. Vibrating element 26 is formed between the ground electrode 34 and a pair of top vibrating electrodes 36, 38.

The filter 20 is connected to external circuitry via lead terminals 40, 42 and 44. Lead terminal 40 is connected to a central ground electrode 46 (preferably by soldering) which is centrally located in the bottom surface of piezoelectric substrate 22. The central ground electrode 46 is coupled to the ground electrodes 28, 34 by respective bridge electrodes (unnumbered).

The lead terminal 42 is coupled to vibrating element 24 via an input/output electrode 46. The connection is preferably made by soldering. The lead electrode 44 is coupled to the vibrating element 26 via input/output electrode 48, also preferably by soldering.

In accordance with the present invention, a coupling capacitor C is provided by forming a capacitor electrode 50 on the top surface of the piezoelectric substrate 22 in an area opposing the ground electrode 46. To avoid undesired vibration in the area of the coupling capacitor C, a damper 52 is formed on top of the capacitor electrode 50.

In order to avoid the possibility of forming a solder bridge between the ground electrode 46 and capacitor electrode 50, the damper 52 is preferably formed of a resin material such as a conductive paste mainly composed of an epoxy resin having a large mass or an epoxy resin itself on which no solder will adhere. Preferably, the conductive paste covers the entire top surface of the capacitor electrode 50 to prevent solder used in connecting the lead terminal 40 with the ground electrode 46 from adhering to any portion of the capacitor electrode 50. The damper 52 serves both to prevent the formation of a solder bridge and to dampen unnecessary vibrations which are generated because the middle portion of the piezoelectric substrate 22 comprising the coupling capacitor C is polarized. Interference between vibrating elements 24, 26 may be reduced by fully damping the unnecessary vibration between those elements.

The side surfaces of the piezoelectric substrate 22 are preferably covered by an insulating protective resin 23.

Figure 2A:
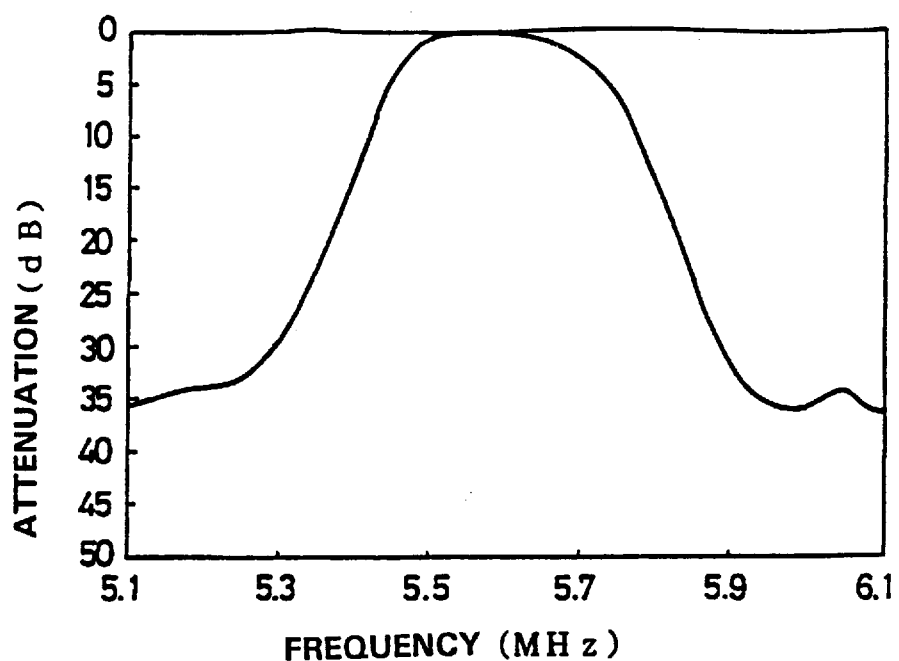
FIGS. 2a and 2b are graphs illustrating the waveform selectivity of a preferred embodiment of the invention and the prior art device of FIG. 5, respectively.
Figure 2B:
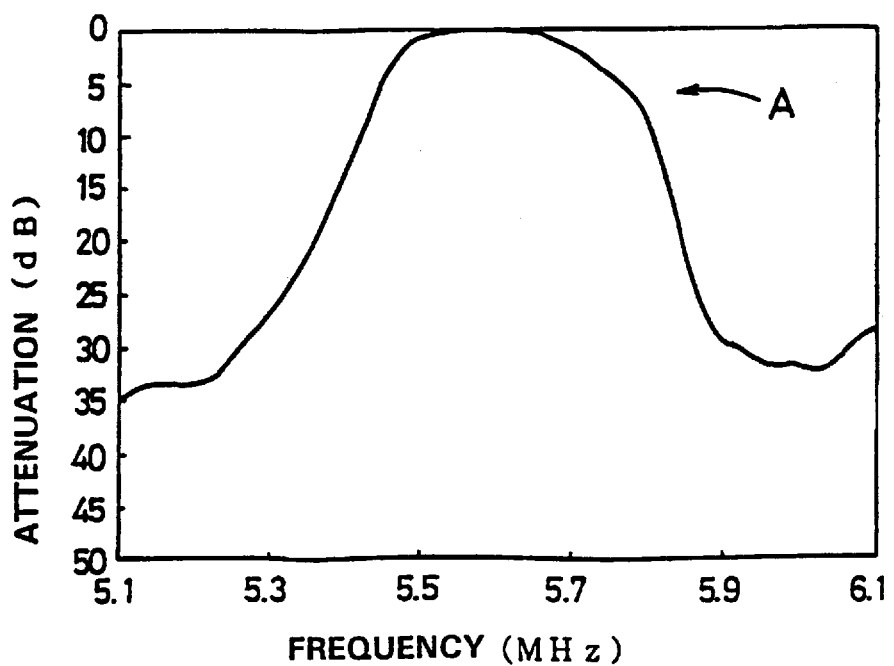
Figure 3A:
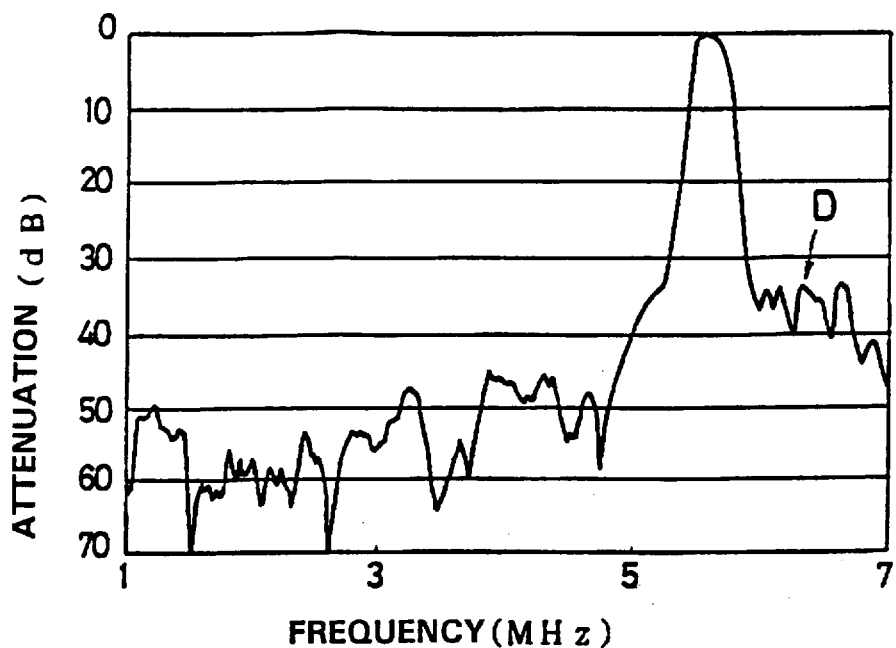
FIGS. 3a and 3b are graphs illustrating spurious waveforms generated by a preferred embodiment of the present invention and the prior art device of FIG. 5, respectively.
Figure 3B:
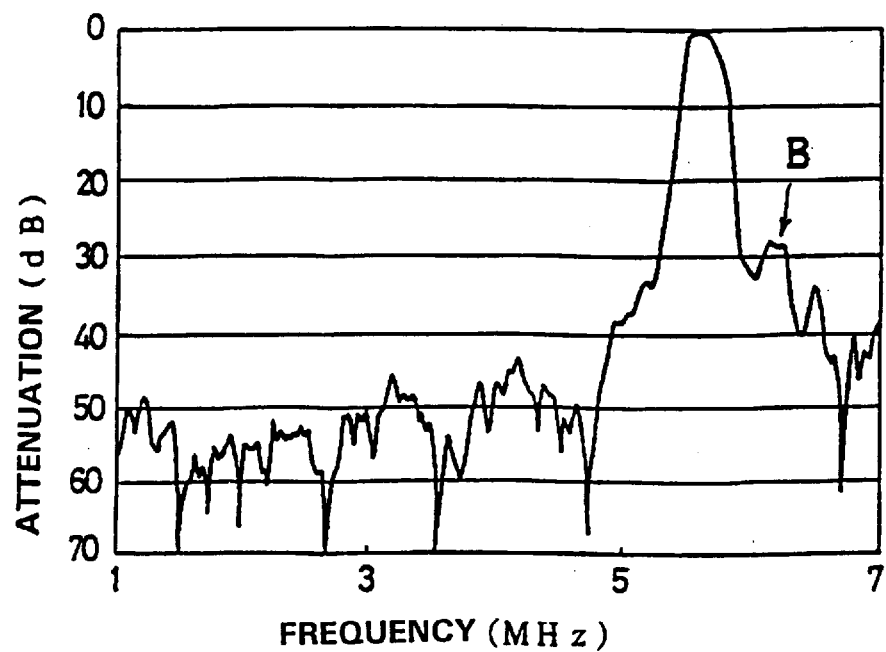
Figure 4:
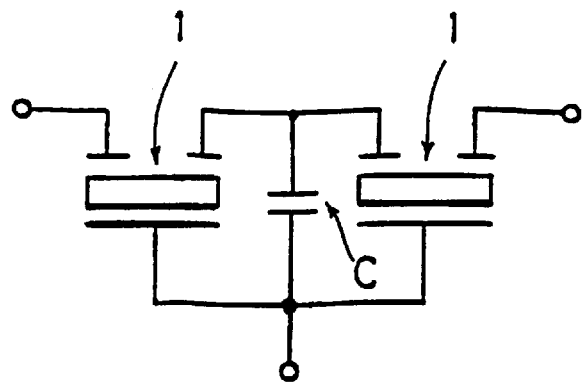
FIG. 4 is an equivalent circuit diagram showing an electrical structure of a prior art thickness extension vibration type dual mode piezoelectric filter.
Figure 5:
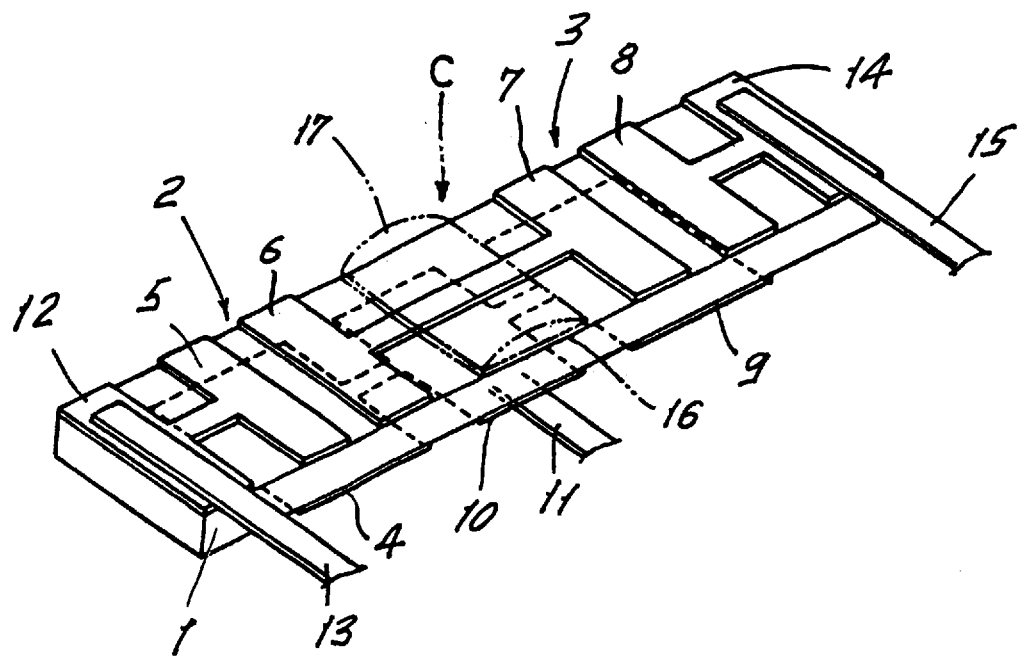
FIG. 5 is a perspective view showing a prior art thickness shear vibration type double mode piezoelectric filter.

The improved characteristics achieved by the present invention are shown in the test results illustrated in FIGS. 2 and 3. FIG. 2a is a graph illustrating the waveform selectivity of the piezoelectric filter of the present invention and FIG. 2b is a graph illustrating the waveform selectivity in the prior art filter of FIG. 5. FIG. 3a is a graph illustrating spurious responses in the piezoelectric filter of the present invention and FIG. 3b is a graph illustrating spurious responses in the prior art filter of FIG. 5. The vertical axis in FIGS. 2 and 3 represents attenuation (dB) and the horizontal axis represents frequency (MHz). The piezoelectric filter used for this test had a piezoelectric substrate 22 which was 8 mm in length, 1.2 mm in width and 0.2 mm in thickness.

As is apparent from FIGS. 2a and 2b, while the attenuation of the prior art filter at frequencies in the area of letter A for the prior art filter was stretched out, this did not happen in the filter of the present invention, thus improving the selectivity of the filter of the present invention. It is also apparent from areas D and B of FIGS. 3a and 3b, respectively, that the level of spurious signals is significantly improved using the filter of the present invention.

It is noted that although the dual mode filter of the embodiment illustrated in FIG. 1 includes two vibrating elements 24, 26, the present invention is not so limited. Three or more vibrating elements may be disposed in parallel as desired. Further, although a piezoelectric filter having lead terminals has been shown in the preferred embodiment, the present invention is not confined to such a structure. For example, it is possible to utilize the invention in known chip piezoelectric filters by placing the piezoelectric filter into a case.

In accordance with the present invention, the coupling capacitor is formed by a ground electrode and a capacitor electrode formed on opposite surfaces of the piezoelectric substrate at locations opposed to one another. The damper is formed of a resin material on which no solder can adhere and which is provided over the capacitor electrode, so that no solder bridge is formed between the ground electrode and the capacitor electrode even if a lead terminal is soldered to the ground electrode. The mass of the damper is preferably sufficient to fully damp unnecessary vibrations in the piezoelectric substrate in the area of the coupling capacitor. As a result, the coupling capacitor may be provided in a body in the inventive piezoelectric filter without forming a solder bridge and the waveform selectivity may be improved and the level of spurious signals may be decreased.

The present invention may be embodied in other specific forms without departing from the spirit or essential attributes thereof and, accordingly, reference should be made to the appended claims, rather than to the foregoing specification, as indicating the scope of the invention.

What is claimed is:

1. A thickness shear vibration type double mode filter, comprising:

a piezoelectric substrate having a pair of opposing main surfaces and at least one side surface extending between said main surfaces;

a pair of vibrating elements disposed in parallel on said main surfaces of said piezoelectric substrate;

a coupling capacitor provided between said vibrating elements, said coupling capacitor being defined by a capacitor electrode and a ground electrode formed on said opposing major surfaces at a position substantially intermediate said vibrating elements; and a passive, inertial damper formed on top of said capacitor electrode, said damper being formed of a resin material on which no solder adheres, said main surfaces of said piezoelectric substrate being substantially devoid of said resin material.

2. The thickness shear vibration type double mode filter of claim 1, wherein said capacitor electrode is formed on a first of said opposing main surfaces and said ground electrode is formed on a second of said opposing main surfaces and wherein both input and output electrodes of said vibrating elements are also formed on said first of said opposing main surfaces.

3. The thickness shear vibration type double mode filter of claim 1, wherein said damper covers substantially the entire top surface of said capacitor electrode.

4. The thickness shear vibration type double mode filter of claim 1, wherein said damper has sufficient mass to ensure undesirable vibrations which would otherwise be generated by polarization occurring between said capacitor electrode and said ground electrode are substantially prevented.

5. The thickness shear vibration type double mode filter of claim 1, wherein said side surface of said piezoelectric substrate is covered by an insulating protective resin.

6. The thickness shear vibration type double mode filter of claim 1, wherein the mass of said damper is sufficient to fully damp unnecessary vibration in said piezoelectric substrate in the area of said coupling capacitor.

7. The thickness shear vibration type double mode filter of claim 1, wherein said main surface of said piezoelectric substrate on which said capacitor electrode is formed has a length and a width and wherein said capacitor electrode extends across the entire width of said piezoelectric substrate and said passive, inertial damper also extends along said entire width of said piezoelectric substrate.

8. The thickness shear vibration type double mode filter of claim 1, wherein said damper does not include metallic material.

* * * * *